(12) United States Patent
Fukushima et al.

(10) Patent No.: US 8,870,627 B2
(45) Date of Patent: Oct. 28, 2014

(54) POLISHING METHOD AND POLISHING APPARATUS

(75) Inventors: Hiroto Fukushima, Tokyo (JP); Akira Horiguchi, Osaka (JP); Ken Isobe, Osaka (JP); Tomonori Miura, Tokyo (JP); Shoji Nakao, Tokyo (JP)

(73) Assignee: Sumco Corporation, Tokyo (JP)

(*) Notice: Subject to any disclaimer, the term of this patent is extended or adjusted under 35 U.S.C. 154(b) by 297 days.

(21) Appl. No.: 13/496,685

(22) PCT Filed: Aug. 20, 2010

(86) PCT No.: PCT/JP2010/005154
§ 371 (c)(1),
(2), (4) Date: May 17, 2012

(87) PCT Pub. No.: WO2011/033724
PCT Pub. Date: Mar. 24, 2011

(65) Prior Publication Data
US 2012/0220200 A1    Aug. 30, 2012

(30) Foreign Application Priority Data
Sep. 18, 2009  (JP) .................................. 2009-217059

(51) Int. Cl.
*B24B 37/08*     (2012.01)
*H01L 21/687*    (2006.01)
*B24B 37/04*     (2012.01)
*H01L 21/68*     (2006.01)
*H01L 21/683*    (2006.01)
*B24B 37/34*     (2012.01)

(52) U.S. Cl.
CPC ............... *B24B 37/042* (2013.01); *B24B 37/08* (2013.01); *H01L 21/68707* (2013.01); *H01L 21/68* (2013.01); *H01L 21/6838* (2013.01); *B24B 37/345* (2013.01)
USPC .............................. 451/60; 451/262; 451/267

(58) Field of Classification Search
CPC ........ B24B 37/08; B24B 37/345; B24B 21/04
USPC ......... 451/287–290, 331, 334, 367, 387, 368, 451/262, 267, 60; 901/31, 39; 414/935, 414/941; 294/86.4; 198/375
See application file for complete search history.

(56) References Cited

U.S. PATENT DOCUMENTS 3,891,406 A * 6/1975 Yoshino ........................ 451/246
5,174,067 A * 12/1992 Hasegawa et al. ............. 451/291
(Continued)

FOREIGN PATENT DOCUMENTS

JP    60157231 A      8/1985
JP    S60-157231      8/1985
(Continued)

OTHER PUBLICATIONS

International Search Report for WO2011/033724 dated Sep. 14, 2010.
(Continued)

*Primary Examiner* — George Nguyen
(74) *Attorney, Agent, or Firm* — Thomas J. Engellenner; Reza Mollaaghababa; Pepper Hamilton LLP (57) ABSTRACT

To propose a method for realizing appropriate delivering of works to carriers in the conventional transfer process. Specifically, in a polishing method for polishing a work retained in a carrier, at least one carrier for retaining a work to be polished is placed between an upper plate and a lower plate; the work is fit in a hole of the carrier; the carrier and the work are inserted between the upper plate and the lower plate; and at least one of the upper plate and the lower plate is rotated while supplying a polishing agent to a space between the upper plate and the lower plate. In fitting the work in the hole of the carrier, an end portion of the work is held and the work is carried to a position above the lower plate; the work is positioned with respect to the hole of the carrier on the lower plate; and the work is released from the hold and guided by a guide to be slowly carried down toward the hole.

8 Claims, 7 Drawing Sheets

(56) References Cited

U.S. PATENT DOCUMENTS

| | | | |
|---|---|---|---|
| 5,333,413 A * | 8/1994 | Hashimoto | 451/9 |
| 5,679,055 A * | 10/1997 | Greene et al. | 451/10 |
| 5,700,046 A * | 12/1997 | Van Doren et al. | 294/119.1 |
| 5,947,802 A * | 9/1999 | Zhang et al. | 451/334 |
| 6,113,490 A * | 9/2000 | Hakomori | 451/288 |
| 6,139,408 A * | 10/2000 | Hakomori | 451/267 |
| 6,155,908 A * | 12/2000 | Hakomori | 451/28 |
| 6,186,873 B1 * | 2/2001 | Becker et al. | 451/54 |
| 6,196,906 B1 * | 3/2001 | Hakomori | 451/339 |
| 6,909,276 B2 * | 6/2005 | Hofer et al. | 324/750.22 |
| 7,048,316 B1 * | 5/2006 | Blank et al. | 294/213 |
| 7,645,366 B2 * | 1/2010 | Hanson et al. | 204/297.08 |
| 7,751,172 B2 * | 7/2010 | Purohit et al. | 361/234 |
| 8,567,837 B2 * | 10/2013 | Chang et al. | 294/213 |
| 2006/0226000 A1 * | 10/2006 | Hanson et al. | 204/242 |
| 2007/0281589 A1 * | 12/2007 | Oh et al. | 451/11 |
| 2013/0034420 A1 * | 2/2013 | Hjornet | 414/752.1 |

FOREIGN PATENT DOCUMENTS

| | | |
|---|---|---|
| JP | S60-157231 A | 8/1985 |
| JP | 61203269 A | 9/1986 |
| JP | S61-203269 A | 9/1986 |
| JP | 3154772 A | 7/1991 |
| JP | 11267964 A | 10/1999 |
| JP | H11-267964 | 10/1999 |
| JP | H11-267964 A | 10/1999 |
| JP | 2000150620 A | 5/2000 |
| JP | 2000326222 A | 11/2000 |

OTHER PUBLICATIONS

Korean Office Action in Applicants' corresponding Korean patent application No. 10-2012-7009882 dated Mar. 20, 2014 (3 pages).

* cited by examiner

POLISHING METHOD AND POLISHING APPARATUS

TECHNICAL FIELD

The present invention relates to, for example, a polishing method suitable for final polishing of a silicon wafer and an apparatus for final polishing.

RELATED ART

A silicon wafer, which is a material of a semiconductor device, is cut out of a single crystal silicon ingot, and then is subjected to lapping and further subjected to a polishing process called final polishing to be mirror finished. This mirror finishing has been conventionally performed only on a surface on which a device is formed; however, large-diameter wafers having a wafer diameter of more than 8 inches, for example, 12 inches have been required to have their rear surfaces also mirror finished although no device is formed on the rear surfaces.

Figure 1:
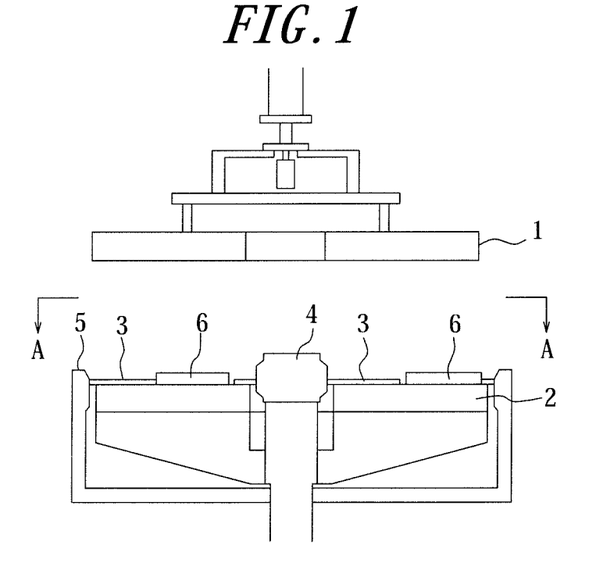
FIG. 1 is a diagram showing the structure of a polishing apparatus.
Figure 2:
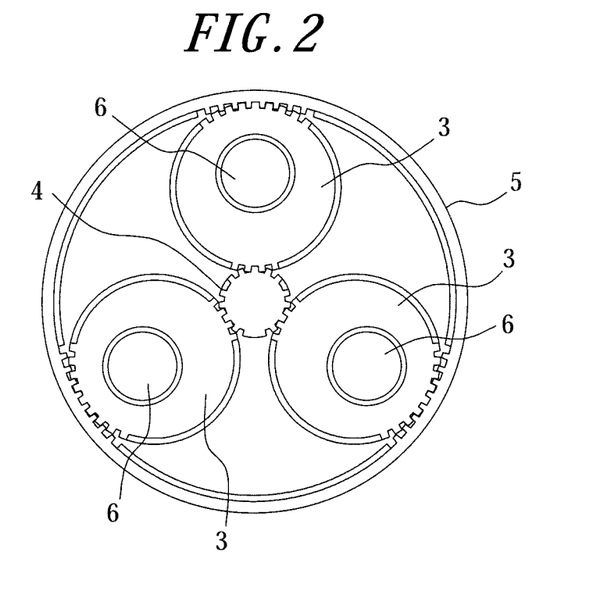
FIG. 2 is a diagram of the polishing apparatus viewed in the direction indicated by the arrows A-A in FIG. 1.

For example, planetary gear driven double side polishing apparatuses are generally used for double side polishing of silicon wafers. One of this type of double side polishing apparatus is, for example, an apparatus simultaneously processing a plurality of wafers that is disclosed in Patent Document 1. Specifically, this double side polishing apparatus includes a pair of rotatable upper plate 1 and a lower plate 2, a plurality of carriers 3 as planet gears placed around the center of rotation between the upper plate 1 and the lower plate 2, a sun gear 4 placed at the center of rotation between the upper plate 1 and the lower plate 2, and an annular internal gear 5 placed at a peripheral portion between the upper plate 1 and the lower plate 2 as shown in FIG. 1 and FIG. 2.

The upper plate 1 can be raised and lowered, and its rotation direction is opposite to the rotation direction of the lower plate 2. Polishing cloths (not shown) are attached to surfaces of the upper plate 1 and the lower plate 2 which face each other. Further, the carriers 3 each have an eccentrically located circular hole (receiving hole) 3a. Circular works 6, typically silicon wafers, are retained in the holes 3a. The sun gear 4 and the internal gear 5 are engaged with the plurality of carriers 3 inside and outside, respectively, and they are generally driven to rotate in the same direction as the lower plate 2.

Final polishing is performed by raising the upper plate 1, placing the plurality of carriers 3 on the lower plate 2, then transferring the works 6 onto the lower plate 2, and separately delivering the works 6 to the carriers 3. After the works 6 are delivered, the upper plate 1 is lowered, so that the works 6 are inserted between the upper plate 1 and the lower plate 2, specifically between the upper and lower polishing cloths. In this state, while a polishing agent is supplied to the space between the upper plate 1 and the lower plate 2, the sun gear 4 and the internal gear 5 are driven to rotate.

This rotation drive makes the plurality of carriers 3 revolve around the sun gear 4 and spin between the upper plate 1 and the lower plate 2 that rotate in reverse. This allows the plurality of works 6 to be double side polished simultaneously.

In the above final polishing, the lower plate 2 has been conventionally fixed, and the works 6 have been transferred by a vacuum transfer robot into the plurality of carriers 3 placed on the lower plate 2. As a result of increase in the size of gears surrounding the plate with increase in the size of works, and accompanying increase in the tolerance; the positions of the carriers placed on the lower plate would be inaccurate. On the other hand, the tolerance between the inner diameter of the carriers 3 and the outer diameter of the work 6 tends to be more strictly limited. For these reasons, there has been a risk in a method by which works are mechanically transferred into carriers on a rotating plate, in that the works would not completely fit in the carriers. Thus, monitoring and adjustment by operators are necessary, which has been a major impediment to achieving full automation of the process.

With this being the situation, Patent Document 1 proposes combining works and carriers to be detachably assembled, and then delivering the works with the carriers being assembled together onto a lower plate.

The proposed technique eliminates the need for monitoring and adjustment by operators, and contributes to achieving fully automatic delivering of works onto a lower plate.

PRIOR ART DOCUMENT

Patent Document

Patent Document 1: JP 2000-326222A

DISCLOSURE OF THE INVENTION

Problems to be Solved by the Invention

In the above technique, works and carriers are necessarily assembled together in advance, and the assembling step needs to be performed prior to the conventional transfer process using a transfer robot, which inevitably increases the number of steps. Therefore, as improvement in the production efficiency and energy saving are demanded, a proposal of a method for realizing appropriate delivering of works to the above polishing apparatus even by the conventional transfer process has been desired.

Further, since so-called vacuum suction has been used for transferring works in the conventional transfer using a transfer robot, a mirrored surface of a work is accordingly sucked by vacuum when the work is removed after polishing. This has required careful handling because polishing agent, dirt, and dust attached to the suction surface would adhere to a surface of the work having been polished to cause product failure.

In view of the above, an object of the present invention is to solve the above problems and to propose a method for realizing appropriate delivering of works to carriers in the conventional transfer process.

Means for Solving the Problem

The inventors made various studies on a method for appropriately delivering works into carriers on a plate of a polishing apparatus, and established a method of appropriately introducing works into carriers by holding ends of the works to transfer them. Thus, they completed the present invention.

Specifically, the present invention primarily includes the following constituents.

(1) A polishing method for polishing a work retained in a carrier, the polishing method comprising the steps of:

placing at least one carrier for retaining a work to be polished between an upper plate and a lower plate;

fitting the work in a hole of the carrier;

inserting the carrier and the work between the upper plate and the lower plate; and rotating at least one of the upper plate and the lower plate while supplying a polishing agent to a space between the upper plate and the lower plate, wherein in fitting the work in the hole of the carrier, an end portion of the work is held and the work is carried to a position above the lower plate; the work is positioned with respect to the hole of the carrier on the lower plate; and the work is released from the hold and guided by a guide to be slowly carried down toward the hole.

(2) The polishing method according to (1) above, wherein during the process of carrying of the work down toward the hole, a fluid is sprayed from above toward the work.

(3) The polishing method according to (1) or (2) above, wherein after the polishing, the distance between the upper plate and the lower plate is increased, and then a fluid is sprayed from the lower plate toward the work to raise the work away from hole of the carrier, and an edge surface of the work is held to remove the work.

(4) A polishing apparatus comprising:
a lower plate on which at least one carrier for retaining a work to be polished is placed;
an upper plate being a counterpart of the lower plate; and
a transfer mechanism for delivering the work toward a hole of the carrier,
wherein at least one of the upper plate and lower plate is rotatable,
the transfer mechanism has edge grippers that can be moved forward and backward, which support the work at least at three points on the edge surface side, and
inclined guide surfaces for guiding the work having been released from the hold toward the hole of the carrier are provided on the grippers on the work side.

(5) A polishing apparatus comprising:
a lower plate on which at least one carrier for retaining a work to be polished is placed;
an upper plate being a counterpart of the lower plate;
a transfer mechanism for delivering the work toward the hole of the carrier; and
wherein at least one of the upper plate and lower plate is rotatable, and
the transfer mechanism has edge grippers that can be moved forward and backward, which supports the work at least at three points on the edge surface side, and guides for guiding the work having been released from the hold toward the hole of the carrier.

(6) The polishing apparatus according to (4) or (5) above, wherein the transfer mechanism has at least two alignment pins that fit in at least two alignment holes provided in the carrier.

Effect of the Invention

According to the present invention, a work is ensured to be supplied into a carrier with a polished surface being untouched by means of holding an end portion of the work which is not polished, for example, the peripheral edge surface of a wafer, without greatly changing a conventional transfer process. Further, removal of the work having been polished can also be realized with the polished surface being untouched, thus preventing foreign matter from adhering.

BEST MODE FOR CARRYING OUT THE INVENTION

A polishing method of the present invention will be described in detail with respect to a case where a work is a wafer, in reference to FIGS. 3 to 7. FIGS. 3 to 7 each show a case of applying the present invention to an apparatus for polishing one wafer, and the polishing mechanism of those apparatuses is basically the same as that of the apparatuses shown in FIGS. 1 and 2. Therefore, illustration and description of the polishing mechanism will be omitted, and a mechanism for transferring a wafer is mainly illustrated. Accordingly, those apparatuses have the same mechanism in which an upper plate 1 and a lower plate 2 are driven to rotate while a polishing agent is supplied to a space between the upper plate 1 and the lower plate 2. On this occasion, a carrier is driven to rotate not by a sun gear 4 and an internal gear 5, but for example by small gears engaged with the carrier at four positions evenly spaced on the periphery of the carrier.

A polishing apparatus of the present invention includes a transfer mechanism 7 for delivering a wafer 6 that is a work into a hole 3a of the carrier 3 in addition to the above described polishing mechanism. The transfer mechanism 7 includes, for example, a base plate 8 attached to tips of a robot arm (not shown) and edge grippers 9 that can be moved forward and backward (inward and outward), which are provided at least at three positions evenly spaced on the same circumference of the base plate 8, at four positions in the exemplary illustration. Each of the edge grippers 9 has an inclined guide surfaces 9a inclining inward from the middles of the gripper.

Figure 3:
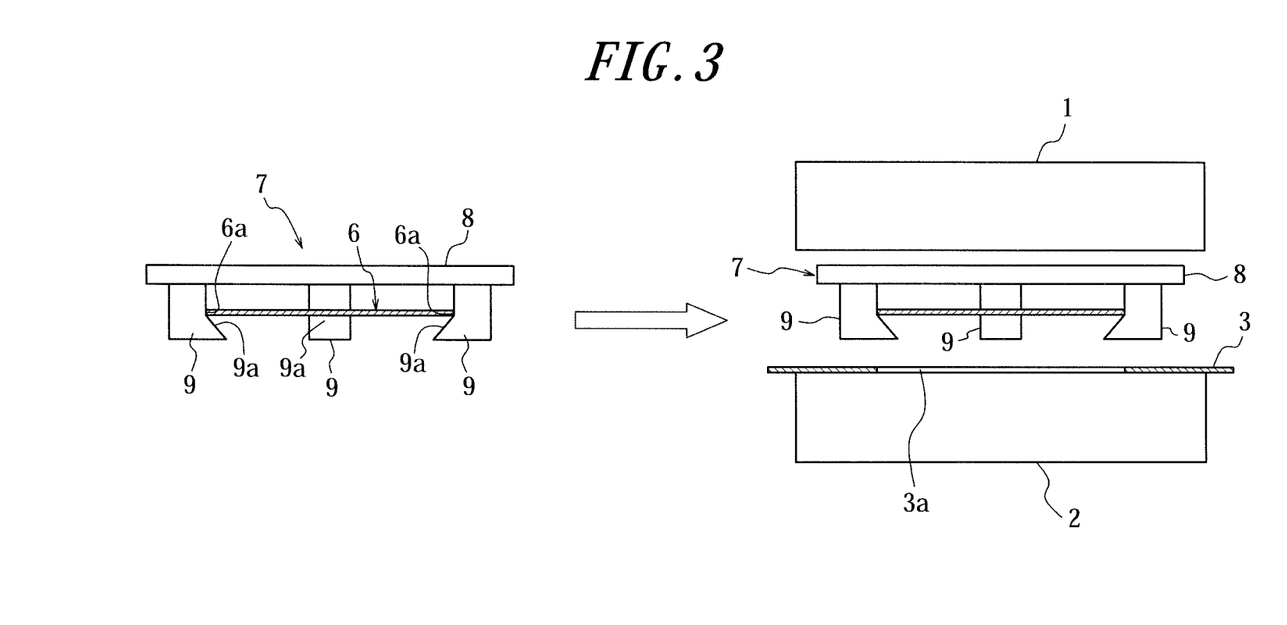
FIG. 3 is a diagram showing a process of transferring a work into a carrier according to the present invention.

In a polishing apparatus including such a transfer mechanism 7, as show in FIG. 3, the transfer mechanism 7 is first moved by the robot arm to a position where the wafer 6 rests, the edge grippers 9 are opened to introduce the wafer 6 into a space inside the group of edge grippers 9, and the edge grippers 9 are closed, so that the edge surface 6a of the wafer 6 is held at the middles of the edge grippers 9, that is, the starting points of the inclined guide surfaces 9a. Here, the edge surface 6a of the wafer 6 is held in such a manner that the edge grippers 9 are not pressed against the edge surface 6a of the wafer 6, preferably in a manner that the wafer 6 is placed on the starting points of the inclined guide surfaces 9a to be held by the edge grippers 9.

Meanwhile, the carrier 3 is placed on the lower plate 2 of the polishing apparatus in advance.

Figure 4:
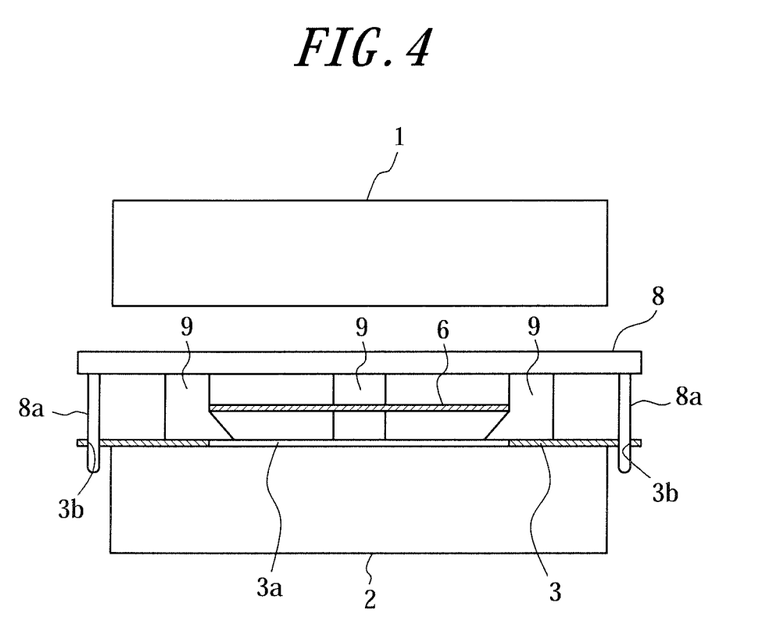
FIG. 4 is a diagram showing a process of transferring a work into a carrier according to the present invention.

Next, as shown in FIG. 3, the transfer mechanism 7 with the wafer 6 being held at the starting points of the inclined guide surfaces 9a is carried to a position above the lower plate 2. On this occasion, the work 6 is positioned with respect to the hole 3a of the carrier 3 on the lower plate 2. Specifically, as shown in FIG. 4, when the transfer mechanism 7 is lowered toward the carrier 3, at least two alignment pins, three alignment pins 8a in the drawing, which are provided on the base plate 8 are inserted into at least two alignment holes, three alignment holes 3b in the drawing, which are provided in the carrier 3; thus, the wafer 6 is accurately positioned right above the hole 3a.

Figure 5:
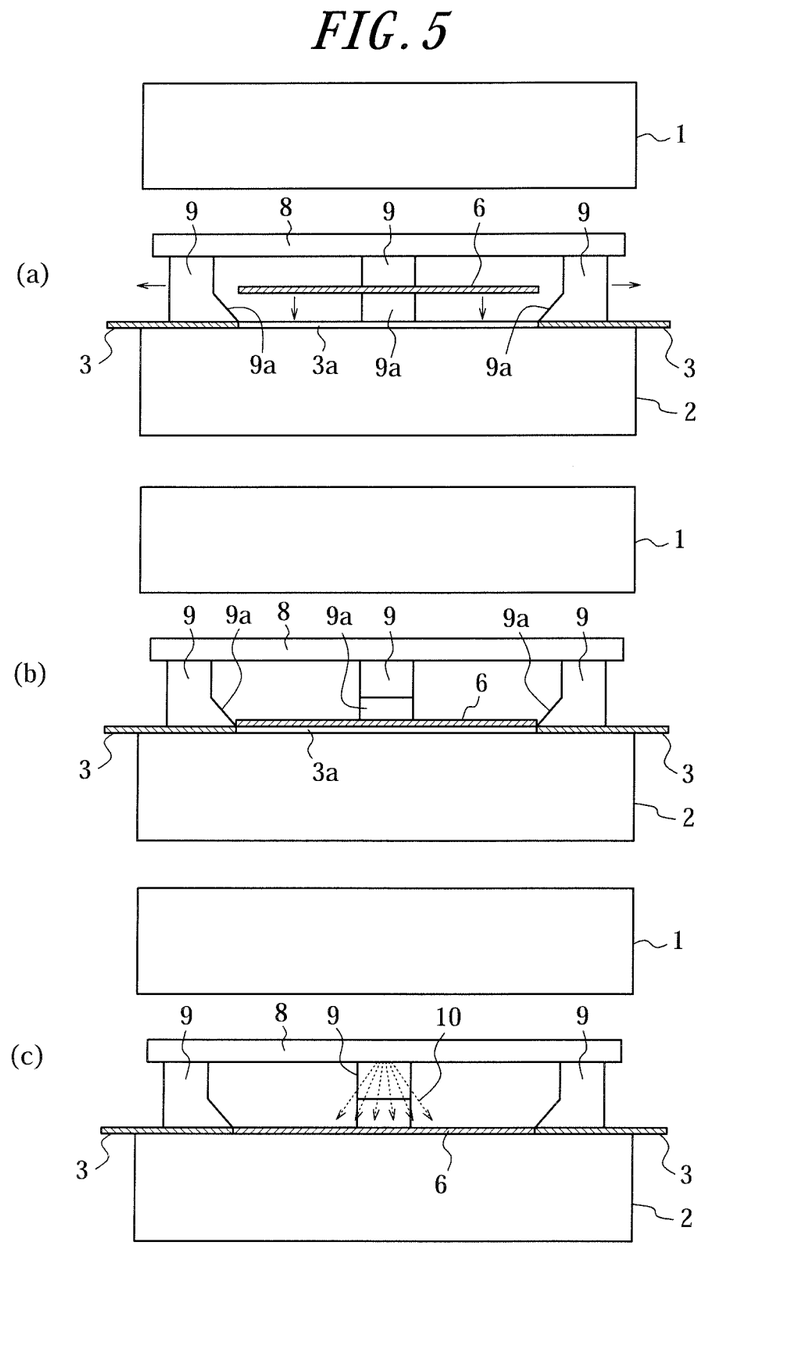
FIG. 5 is a diagram showing a process of transferring a work into a carrier according to the present invention.

After that, as shown in FIG. 5(a), the edge grippers 9 are opened so that the distance between (diameter of) the edge grippers 9 is increased to slightly exceed the diameter of the wafer 6 (almost the same diameter range). Through this process of opening the edge grippers 9, the wafer 6 is slowly carried down (fallen) by its own weight toward the hole 3a with a guide of the inclined guide surfaces 9a (see FIG. 5(b)).

During or after this falling of the wafer 6, as shown in FIG. 5(C), a fluid, for example, purified water 10 is sprayed from the base plate 8 toward the wafer 6 to press and fix the wafer 6 against the hole 3a.

Figure 6:
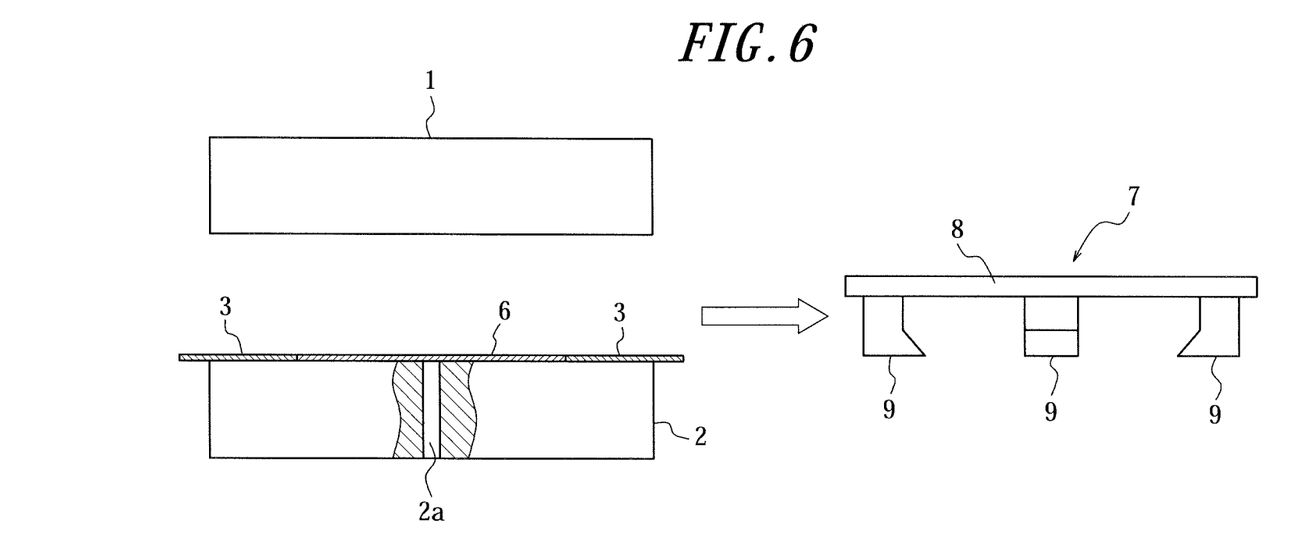
FIG. 6 is a diagram showing a process of transferring a work into a carrier according to the present invention.

If the wafer 6 is accurately fit into the hole 3a, as shown in FIG. 6, so-called vacuum evacuation is performed through a vacuum suction hole 2a of the lower plate 2 to rigidly fix the wafer 6 inside the hole 3a. Note that if the pressure of the vacuum evacuation is measured, whether the wafer 6 is accurately fit into the hole 3a can be checked easily.

Finally, as shown in FIG. 6, the transfer mechanism 7 is removed from the space between the upper and lower plates 1 and 2, and polishing is performed on the wafer 6.

Figure 7:
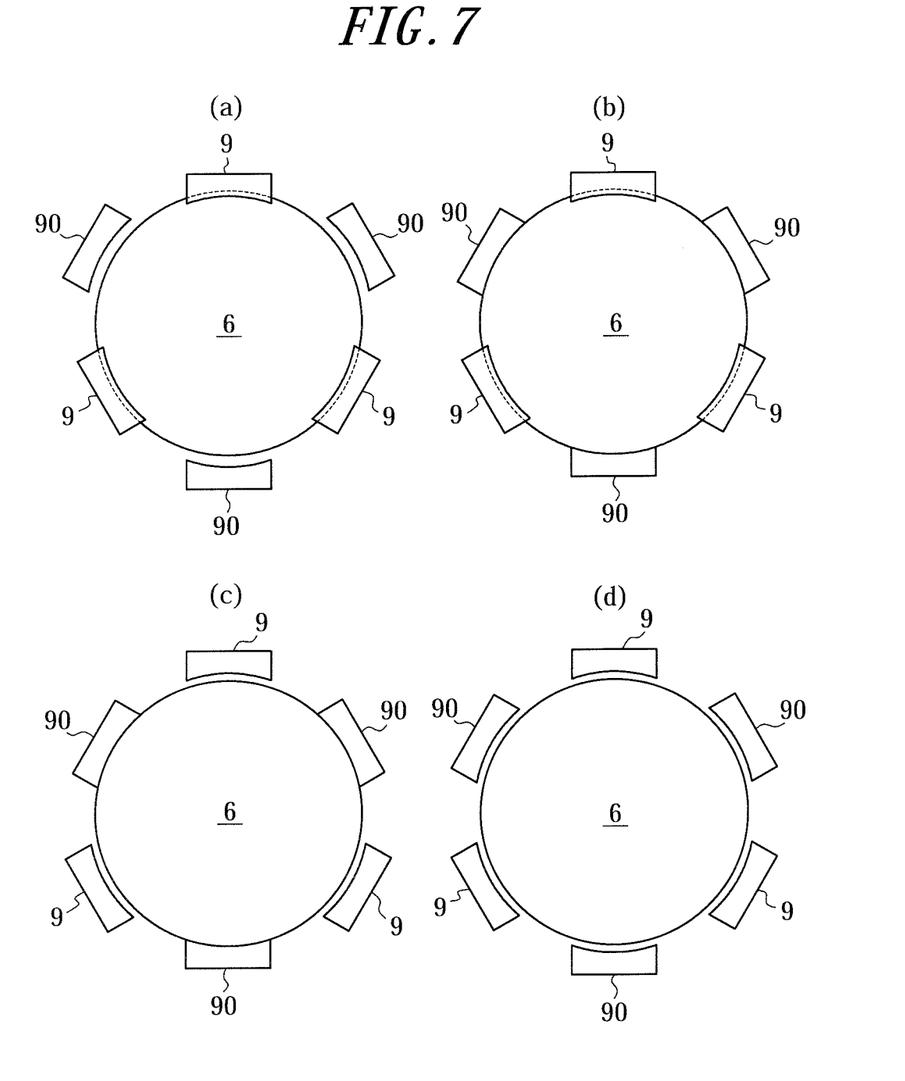
FIG. 7 is a diagram showing another structure of a guide for guiding a work to a carrier.

In the above case, the inclined guide surfaces 9a are provided on the edge grippers 9, thereby guiding the wafer 6 with the inclined guide surfaces 9a toward the hole 3a of the carrier 3. However, in a case where the wafer 6 being held by the edge grippers 9 are viewed from the bottom as in FIG. 7(a), guides 90 are provided in addition to the edge grippers 9 on the transfer mechanism 7. The guides 90 appropriately guide the falling of the wafer 6 in a similar manner to the inclined guide surfaces 9a. Specifically, the guides 90 are provided between three edge grippers 9 at evenly spaced positions; the transfer mechanism 7 is transferred to a position between upper and lower plates 1 and 2 with the wafer 6 being held by the edge grippers 9 as shown in FIG. 7(a); and the guides 90 are closed to approach the wafer 6 to be placed adjacent to the edge of the wafer 6 as shown in FIG. 7(b). In this situation, as shown in FIG. 7(c), the edge grippers 9 are opened, so that the wafer 6 is guided by the guides 90 to be slowly carried down by its own weight toward the hole 3a. After that, as shown in FIG. 7(d), the guides 90 are opened; and the transfer mechanism 7 is then removed from the space between the upper and lower plates 1 and 2; and polishing is performed on the wafer 6.

Figure 8:
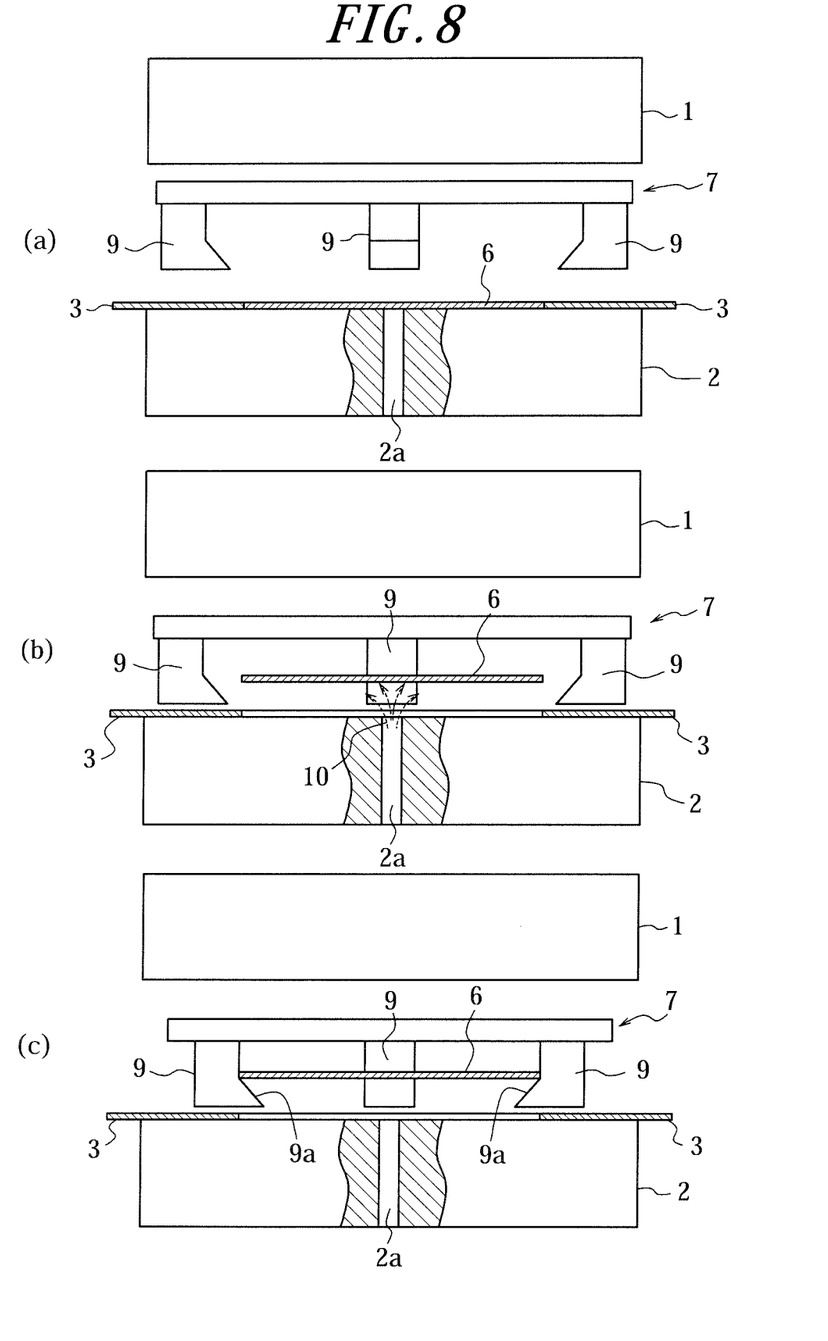
FIG. 8 is a diagram showing a process of removing a work from a carrier according to the present invention.

After the completion of the polishing process, the distance between the upper plate 1 and the lower plate 2 is increased, and the transfer mechanism 7 is transferred to a portion above the lower plate 2 as shown in FIG. 8(a). On this occasion, the distance between the edge grippers 9 are set to be larger than the diameter of the wafer 6. Then, as shown in FIG. 8(b), vacuum evacuation through the vacuum suction hole 2a of the lower plate 2 is stopped, and a fluid, for example, purified water 10 is sprayed from the hole 2a toward the wafer 6 to raise the wafer 6 away from the hole 3a of the carrier 3.

Next, as shown in FIG. 8(c), the edge surface of the wafer 6 being raised is held by the edge grippers 9 being closed to narrow the distance therebetween. Also in this stage, the edge surface 6a of the wafer 6 is held in such a manner that the edge grippers 9 are not pressed against the edge surface 6a of the wafer 6, preferably in a manner that the wafer 6 is placed on the starting points of the inclined guide surfaces 9a to be held by the edge grippers 9. Subsequently, the transfer mechanism 7 is removed from the space between the upper and lower plates 1 and 2; thus, removal of the wafer 6 having been polished is completed.

REFERENCE NUMERALS

1: Upper plate
2: Lower plate
3: Carriers
3a: Hole
3b: Alignment holes
4: Sun gear
5: Internal gear
6: Work (wafer)
7: Transfer mechanism
8: Base plate
8a: Alignment pins
9: Edge grippers
9a: Inclined guide surfaces
90: Guides

The invention claimed is:

1. A polishing method for polishing a work retained in a carrier, the polishing method comprising the steps of:
    placing at least one carrier for retaining a work to be polished between an upper plate and a lower plate;
    fitting the work in a hole of the carrier;
    inserting the carrier and the work between the upper plate and the lower plate; and
    rotating at least one of the upper plate and the lower plate while supplying a polishing agent to a space between the upper plate and the lower plate,
    wherein in fitting the work in the hole of the carrier, an end portion of the work is held and the work is carried to a position above the lower plate; the work is positioned with respect to the hole of the carrier on the lower plate; and the work is released from being held and guided by a guide to be slowly carried down toward the hole.

2. The polishing method according to claim 1, wherein during the process of carrying of the work down toward the hole, a fluid is sprayed from above toward the work.

3. The polishing method according to claim 1, wherein after the polishing, the distance between the upper plate and the lower plate is increased, and then a fluid is sprayed from the lower plate toward the work to raise the work away from hole of the carrier, and an edge surface of the work is held to remove the work.

4. A polishing apparatus comprising:
    a lower plate on which at least one carrier for retaining a work to be polished is placed;
    an upper plate being a counterpart of the lower plate; and
    a transfer mechanism for delivering the work toward a hole of the carrier,
    wherein at least one of the upper plate and lower plate is rotatable,
    the transfer mechanism has edge grippers that can be moved forward and backward, which support the work at least at three points on an edge surface side, and
    inclined guide surfaces for guiding the work having been released from being held toward the hole of the carrier are provided on the grippers on a work side.

5. A polishing apparatus comprising:
    a lower plate on which at least one carrier for retaining a work to be polished is placed;
    an upper plate being a counterpart of the lower plate;
    a transfer mechanism for delivering the work toward the hole of the carrier; and
    wherein at least one of the upper plate and lower plate is rotatable, and
    the transfer mechanism has edge grippers that can be moved forward and backward, which supports the work at least at three points on an edge surface side, and guides for guiding the work having been released from being held toward the hole of the carrier.

6. The polishing apparatus according to claim 4, wherein the transfer mechanism has at least two alignment pins that fit in at least two alignment holes provided in the carrier.

7. The polishing method according to claim 2 wherein after the polishing, the distance between the upper plate and the lower plate is increased, and then a fluid is sprayed from the lower plate toward the work to raise the work away from hole of the carrier, and an edge surface of the work is held to remove the work.

8. The polishing apparatus according to claim 5, wherein the transfer mechanism has at least two alignment pins that fit in at least two alignment holes provided in the carrier.

* * * * *